United States Patent [19]
Fogelson

[11] Patent Number: 5,994,768
[45] Date of Patent: *Nov. 30, 1999

[54] MULTI-LAYER LEAD FRAME

[75] Inventor: Harry John Fogelson, Nonthaburi, Thailand

[73] Assignee: National Semiconductor Corporation, San Jose, Calif.

[*] Notice: This patent is subject to a terminal disclaimer.

[21] Appl. No.: 09/140,698

[22] Filed: Aug. 26, 1998

Related U.S. Application Data

[63] Continuation of application No. 08/790,274, Jan. 28, 1997, Pat. No. 5,864,173, and a continuation of application No. 08/417,207, Apr. 5, 1995, abandoned.

[51] Int. Cl.⁶ .......................... H01L 23/495; H01L 23/48; H01L 23/34; H01L 23/52
[52] U.S. Cl. .......................... 257/666; 257/668; 257/692; 257/723; 257/736
[58] Field of Search .................................... 257/666, 668, 257/672, 691, 692, 723, 736

[56] References Cited

U.S. PATENT DOCUMENTS

| 4,801,765 | 1/1989 | Moyer et al. | 174/52.4 |
| 5,025,114 | 6/1991 | Braden . | |
| 5,382,546 | 1/1995 | Yamada et al. . | |
| 5,442,231 | 8/1995 | Miyamoto et al. | 257/668 |
| 5,461,255 | 10/1995 | Chan et al. | 257/672 |

FOREIGN PATENT DOCUMENTS

| 53023572 | 3/1978 | Japan . |
| 58130550 | 8/1983 | Japan . |
| 60-180154 | 9/1985 | Japan . |
| 02090635 | 3/1990 | Japan . |
| 2-209760 | 8/1990 | Japan . |
| 3-283646 | 12/1991 | Japan . |
| 4-163956 | 6/1992 | Japan . |
| 4-199740 | 7/1992 | Japan . |
| 5-299456 | 11/1993 | Japan . |
| 6-104369 | 4/1994 | Japan . |
| 06252332 | 9/1994 | Japan . |
| 6-252332 | 9/1994 | Japan . |

*Primary Examiner*—Teresa M. Arroyo
*Attorney, Agent, or Firm*—Beyer & Weaver, LLP

[57] ABSTRACT

A multi-layer lead frame for use in a semiconductor package is described. The described lead frame is particularly well suited for application where fine pitch leads and/or lead multi-routing capability is required. In one embodiment, the multi-layered lead frame includes a first lead trace layer superimposed over and adhered to a second lead trace layer. The first and second lead trace layers each have a plurality of leads and each layer has an external portion and an internal portion. Each of the leads in the first trace layer has an associated lead in the second trace layer that has a matching external portion. The matching external portions are bonded together when the trace layers are superimposed. At least some of the leads in the first trace layer have different lengths than the matching leads of the second trace layer. This permit the leads to be routed separately, and may be used to facilitate finer lead pitches than would be possible in full thickness lead frames. Methods for producing such lead frames are also described.

14 Claims, 2 Drawing Sheets

MULTI-LAYER LEAD FRAME

This is a continuation application of prior application Ser. No. 08/790,274 filed on Jan. 28, 1997, now U.S. Pat. No. 5,864,173, and application Ser. No. 08/417,207 filed on Apr. 5, 1995, now abandoned.

BACKGROUND OF THE INTENTION

This invention relates generally to lead frames for use in integrated circuit packages. More particularly, it relates to a multi-layer lead frame which is well adapted for achieving fine lead pitch and/or multi-routing capability in integrated circuit packages.

As technology advances in the field of integrated circuits (IC's), high pin count complex IC's are moving toward smaller and smaller geometry's and are becoming more prevalent in semiconductor packages. These IC's are increasingly being packaged in multi-chip configurations that reduce the physical size package relative to single chip packages. Multi-chip packages require corresponding increases in the number of leads or fine pitch lead frames in order to facilitate electrical coupling the IC's to other circuit components on a circuit board, for example.

There have been a variety of package configurations employed in the past that are capable of handling IC's with a high number of input/output (I/O) terminals. By way of example, Tape Automated Bonding (TAB) package structure includes many very fine wiring traces surrounding and bonded to the IC. These fine traces are covered with protective tape and are subsequently connected to larger traces or a lead frame for connection to other components. The advantage of a TAB package is that IC's with a relatively large number of I/O terminals can be coupled with the fine geometry's obtained with the traces at a relatively low cost. Despite the advantages of TAB, there are some noteworthy disadvantages such as not being as structurally stable as most plastic encapsulated packages, and they typically are formed on a substrate or circuit board such that they are not shipped as individual units like encapsulated packages.

The more popular plastic packages, such as Quad Flat Packages (QFP) and Ball Grid Array (BGA) typically use lead frames to electrically couple the IC. Standard lead frames used with QFP's are typically about 6 mils thick and therefore it is difficult to obtain very fine lead pitch at this thickness. A general manufacturing rule of thumb is that the distance between the leads can be as close as the thickness of the leads. Since most lead frames are made by stamping or etching, attempts at reducing the lead pitch much further requires very fine stamping dies which, at these small dimensions, are prone to break or wear out quickly. Etching also has a size limitation since it is often difficult to obtain uniformly smooth sidewalls in deep narrow channels. One approach for overcoming these problems that works well is described in my co-pending application Ser. No. 08/287,872 entitled "A Fine Pitch Lead Frame and Method for Manufacturing Same" filed Aug. 9, 1994 which is incorporated herein by reference. The present application seeks to provide a lead frame structure that is capable of provided a very fine lead pitch arrangement and having multi-layer routing capability such that the leads have better access all sides of IC's mounted in multi-chip packages.

SUMMARY OF THE INVENTION

To achieve the foregoing and other objects and in accordance with the purpose of the present invention, a multi-layer lead frame for use in a semiconductor package having fine pitch leads and lead multi-routing capability is described. In a first embodiment of the present invention, a multi-layered lead frame includes a first lead trace layer superimposed over and adhered to a second lead trace layer. The first and second lead trace layers each have a plurality of leads and each layer has an external portion and an internal portion. Each of the leads in the first trace layer has an associated lead in the second trace layer that has a matching external portion. The matching external portions are bonded together when the trace layers are superimposed. At least some of the leads in the first trace layer have different lengths than the matching leads of the second trace layer which permit the leads to be routed separately, and may be used to facilitate finer lead pitches than would be possible in full thickness lead frames. By way of example, when the individual trace layers are approximately 3 mils, lead pitch of less than about 5 mils are readily obtainable.

In one embodiment some of the leads from the first trace layer cross non-matching leads in the second trace layer thereby providing multi-routing of leads. In this embodiment, an insulating material is provided between the first and second layers. By way of example, polyimide tape works well as the insulating material. In another embodiment, the multi-layered lead frame may include a first die attach pad that is formed as part of the first trace layer and may optionally further include a second die attach pad that is formed as part to the second trace layer.

In another aspect of the invention, an integrated circuit package is provided which incorporates a multi-layer lead frame as described above. The package further includes an integrated circuit die having a multiplicity of bond pads, connecting wires for electrically coupling the bond pads to associated ones of the lead traces. An encapsulation material is molded over the die, connecting wires, and an internal lead portion of the lead frame to form an protective package. The exterior portion of the lead frame is then formed into a plurality of pins that are arranged to electrically connect the semiconductor package to external circuit components. In another embodiment, a plurality of integrated circuit dies may be provided and electrically connected to the lead frame. Each of the dies may optionally be attached to an associated die attach pads formed from a portion of an associated one of the trace layers.

A method of forming a lead frame in accordance with a first embodiment is also described. The method includes fabricating a first lead trace layer having a multiplicity of leads, fabricating a second lead trace layer having a multiplicity of leads. At least some of the leads in the second trace layer have different lengths and/or routings than corresponding leads in the first trace layer. The fabricated trace layers are then aligning such that the second trace layer is superimposed over the first trace layer and adhering together to form a lead frame as described above.

DESCRIPTION OF THE DRAWINGS

The invention, together with further objects and advantages thereof, may best be understood by reference to the following description taken in conjunction with the accompanying drawings in which.

DETAILED DESCRIPTION OF THE PREFERRED EMBODIMENTS

Figure 1:
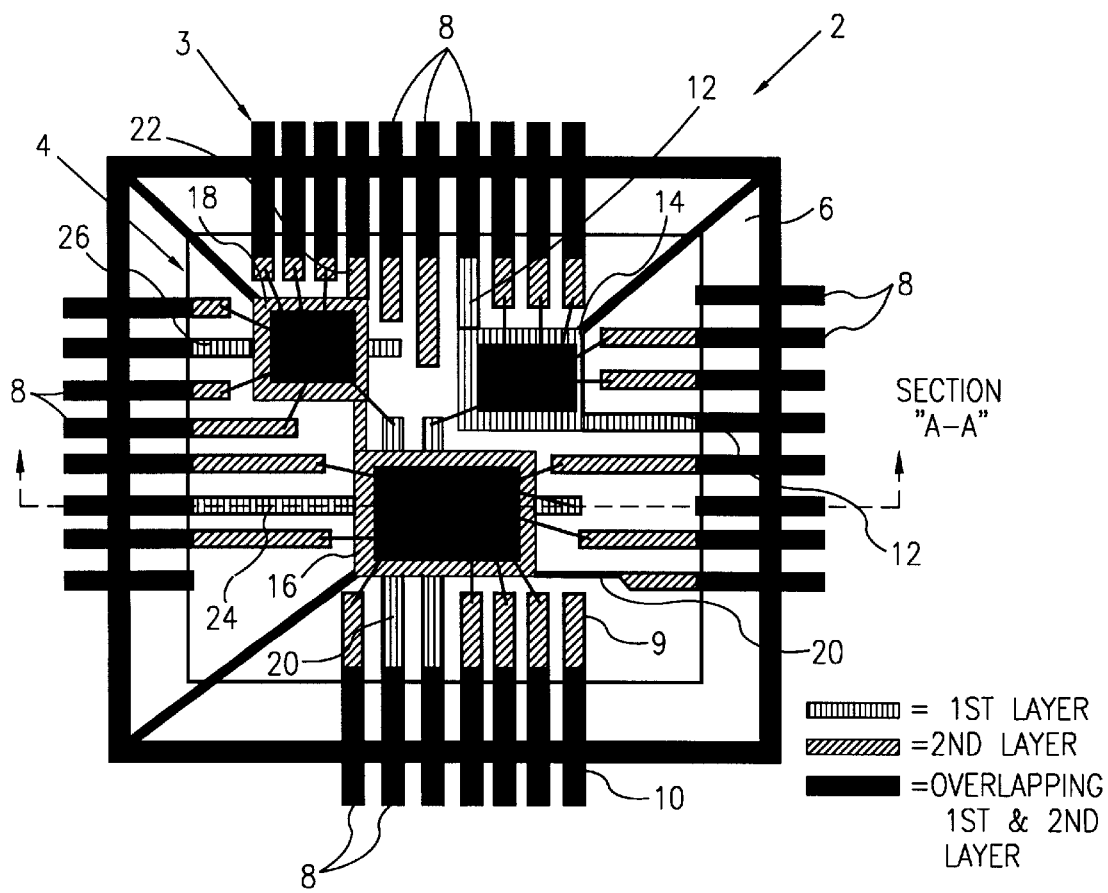
FIG. 1 is a diagrammatic top view of a first embodiment of a multi-layer lead trace with die attached and wire bonded to the varying length leads.

Referring initially to FIG. 1, an integrated circuit package 2 comprising a multi-layer lead frame structure 3 in accordance with a first embodiment of the present invention will be described. The multi-layer lead frame 3 includes a first lead trace layer 32 superimposed over and adhered to a second lead trace layer 34. The trace layers are thinner than standard full thickness lead frames which permits a reduction in lead pitch. The first and second lead trace layers each have a plurality of leads 8 and each lead has an outer portion 9 and an inner portion 10. The outer portions of the first and second trace layers have substantially identical patterns and are superimposed and bonded together . At least some of the leads in the first trace layer have different lengths than the matching leads of the second trace layer which permit the leads to be routed separately. This difference may also be used to facilitate finer lead pitches than would be possible in full thickness lead frames.

The internal portion is entirely inside of the package outline 4 which contains leads that are electrically coupled to the die by bonding wires. The external portion of the trace layer area 6, or the contact area of the lead traces when superimposed, is primarily outside of the package outline. The external portion 6 of both lead traces are substantially identical such that each of the leads form single individually isolated leads when superimposed and metallurgically bonded together. As will be appreciated by those skilled in the art, this allows the lead frame structure 2 to be incorporated in standard dimension packages with customer mounting procedures left unchanged. All significant modifications to the lead frame structure occur within the internal portion therefore leaving all changes transparent to the customer.

In the first embodiment, as mentioned above, two trace layers are superimposed to form a first trace layer and a second trace layer. The individual lead trace layers may be formed by any conventional technique used for fabricating lead frames. By way of example, methods such as stamping or etching work well in constructing the trace layers for the present invention. It is also contemplated that additional lead trace layers may be added to obtain even greater multi-routing capability and/or finer pitch. A three or more trace layer structure will work as long as the combined thickness is not greater than the thickness for external pins for that particular application. By way of example, a standard pin thickness for many applications is about 6 mils, therefore the cumulative thickness for a two layer configuration the individual layers should be around 3 mils each, for a three layer configuration, they should be about 2 mils each etc. As shown in FIG. 1, the dark shaded areas in the external portion 6 indicate the areas where the two traces align exactly on top of each other.

Also shown in FIG. 1 are the leads of the both trace layers shown with varying lengths. The leads shown in vertical stripe 10 are leads that extend from the first trace layer. Leads shown in diagonal stripe extend from the second or top trace layer. Die attach pads may be positioned on either the top or bottom layers. By way of example, leads such as 12 extend from the first layer to support die attach pad 18 which is also on the first layer. Die attach pads 16 and 18 are on the second layer and are supported by extended leads 20 and 22 respectively. Additional support for these second layer surfaces is provided by a portion of first layer leads (for example, leads 24 and 26) that are routed underneath die attach pads 16 and 18. Polyimide tape (not shown) is also used for securing the die attach pads to the leads in addition to electrically insulating the crossing leads from the different layers.

Figure 2:
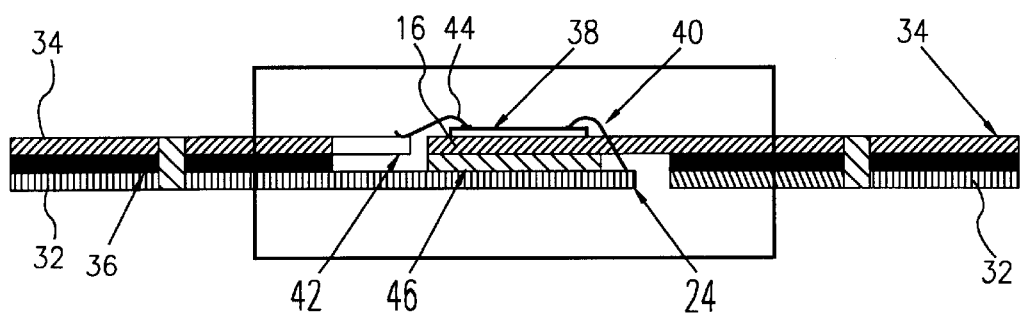
FIG. 2 is a diagrammatic side view of a multi-layer lead trace in FIG. 1 of the present invention.

Referring to FIG. 2, a side view cross section of the FIG. 1 along section AA is shown. As can be clearly seen, the second trace layer 34 is superimposed on the first trace layer 32 and bonded together with conventional high temperature solder 36. Typical packages such as QFPs and others have an industry standard lead frame thickness of around 6 mils. Consequently, the first and second trace layers each have a reduced thickness from that of standard lead frames in order to conform to packaging standards. As mentioned earlier, the reduced thickness of the leads in the present invention permits finer lead pitch than can be achieved from standard 6 mil leads.

The solder 36, in addition to bonding the layers together for subsequent S-shaping of the external pins, is used to maintain consistent thickness of the superimposed traces. In the preferred embodiment, a high temperature solder with a melting point in excess of 250° C. is used since the lead structure is subject to temperatures of at least that high during processing. The thickness of the solder in not critically important except that there must be enough to sufficiently bond the leads together. By way of example, a solder thickness of around 30 micro inches works well in order to bond and maintain a consistent 6 mil cumulative thickness of the lead traces. Incidentally, the solder 36 electrically shorts out the two traces but only on the same lead thus electrical isolation between the leads is maintained.

An IC die 38 is affixed to die attach pad 16 and connected to the second layer trace 34. A principal advantage of the present invention is the multi-routing characteristic of lead trace structure that uses varying length leads to access locations that may be difficult to reach in multi-chip packages with the standard uniform length leads. A die 38 may be electrically coupled to the leads of either the first trace 32 or second layer trace 34 or both. As can be seen, the die 38 is coupled by bonding wire 40 to an lead 24 that extends underneath die attach pad 16 thereby permitting access of trace 32 to the opposite side of the die. The die 38 is also coupled to lead 42 of the second layer 34 by bonding wire 44. This multi-routing aspect allows much more freedom in choosing pin arrangements. An insulating double sided polyimide tape 46 of about 1–2 mils thick is dispose between leads of the first and second layers that cross over each other to maintain electrical isolation between the two traces.

A multi-layer lead frame is constructed out of multiplicity of individual trace layers. A method of making such a lead frame includes first forming the individual trace layers. The individual lead trace layers may be formed by any conventional technique used for fabricating lead frames. By way of example, methods such as stamping or etching work well in constructing the trace layers for the present invention. The trace layers can be constructed from any electrically conductive material but is preferably made of copper or a copper alloy which is stamped out or etched by a process that is well known in the industry. Copper is used primarily because it has the desirable properties of being a good conductor which is relatively easy to etch, in addition to being cost effective. Further steps include aligning the traces together, laying down the tape and bonding the traces together with solder. Alternative methods of bonding such as sintering or ultrasonic welding are also possible. The die attach pads are attached to the leads and may be additionally supported by double sided polyimide tape. The tape also serves to electrically insulate crossing leads from different layers. A method of packaging an integrated circuit device containing a multi-layer lead frame would further include affixing the die to the die attach pads. The die are then electrically coupled to the leads which is typically done by bonding wires. An molding step follows that encapsulates internal portion of the lead frame containing the die, leads, die attach pads, and bonding wires. A commonly used encapsulation material is epoxy since it can be easily and cost effectively applied by transfer molding.

One specific automated method that can be used for constructing a multi-layered lead frame structure as previously described is by using a bonding apparatus for bonding the trace layers. Since lead frame structures are typically stamped or etched into a single sheet of conductive material such as copper and rolled into reels, a multi-reel lead structure bonding apparatus could be employed. For example, for the two layered system described, one reel containing the top trace layer may be located at the top of the apparatus whereas another reel containing the bottom trace layers are located at the bottom of the apparatus. The reels of finished (stamped or etched) trace structures are simultaneously fed as into the apparatus as sheets containing an inert environment. Solder is applied to the surfaces and the sheets are then accurately aligned using computerized vision systems which are found in commercial applications that require precise placement such as those used with pick and place robots in the semiconductor industry. The two trace layers are subsequently pressed together under high pressure and temperature, then cooled, cut and stacked. Prior to entering the bonding apparatus, the sheets of lead trace structures would be would have been subjected to every other process that is performed for conventional lead frames such as etching, cleaning, plating, taping etc. Therefore, all steps prior to entering the bonding apparatus remain unchanged.

Figure 3:
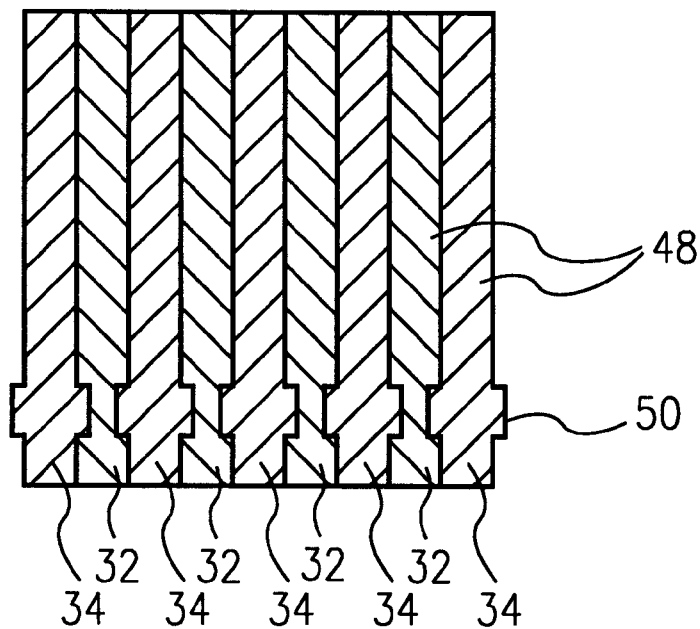
FIG. 3 is a diagrammatic top view of a second embodiment for achieving finer lead pitch of the present invention showing top layer leads offset over the gaps formed by the bottom layer leads.
Figure 4:
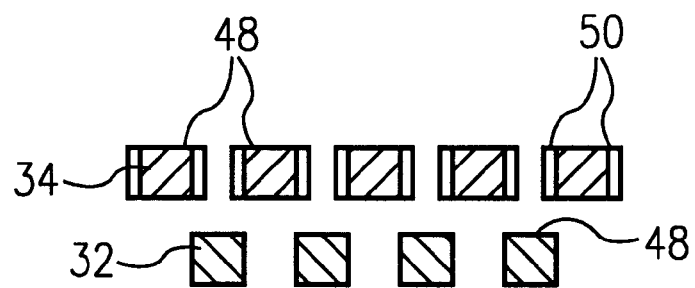
FIG. 4 is a diagrammatic cross sectional end view of FIG. 3 showing side protrusions in the top layer leads.

As mentioned above, a very fine lead pitch is obtained by virtue of the reduced thickness of the leads which may be constructed by a stamping or etching process. An even further reduction in lead pitch may obtained by offsetting the leads of the first layer 34 relative to the second layer 32 as shown in a second embodiment in FIG. 3. An end view cross section shows that the leads of the top second trace 32 are located in the gaps of the bottom first trace layer 34 resulting in even finer lead pitch than that of the first embodiment where the leads were directly superimposed. Since the top surfaces 48 of the leads are bonding surfaces, pressure will be placed on these surfaces during the wire bonding process thereby pressing the top layer leads into the gaps made between the bottom layer leads and therefore potentially causing them to become permanently lodged there between. FIG. 4 shows an end view of the top layer leads 34 fitted with protrusions 50 from the sides of the lead so that they no longer fit into the gaps of the bottom layer leads 32. Any method of preventing entry of the top layer leads into the gaps between the bottom layer leads will work. By way of example, adjusting the offset of the top layer leads 34 with respect to the bottom layer leads 32 or placing a barrier to prevent entry such as a layer of polyimide tape between the bottom trace 32 and the top trace 34 respectively.

The present invention provides the advantages of obtaining multi-layer routing capability in multi-chip packages while maintaining a 6 mil standard external pin thickness. Additionally, the modifications to the above described lead frame structure enables the customer to be free from performing any intermediate steps prior to mounting the die and molding the package. Therefore, the present invention provides the immediate benefits of fine lead pitch and variable routing access to multi-chip packages that can be molded into a standard package. This permits continued use of standard packaging equipment by the customer once the lead structure has been delivered thereby eliminating additional setup costs.

While the invention has been described primarily in terms of a multi-chip Quad Flat Pack package and it should be understood that the invention may be applied to single chip packages and other types of packages as well. Similarly, only one embodiment of the present invention has been described in detail, it should be understood that the present invention may be embodied in other specific forms without departing from the spirit or scope of the invention. Particularly, a two layer structure was described, alternative embodiments consisting of a multi-layer structures of three or more layers may be employed as well. Further, the die was affix to die attach pads in the described embodiment, it should be understood that the die may be affixed to other surfaces instead such as a heat spreader, for example. The multi-layer concept may have applications to other than individual packages, for example, in applications where the multi-layer structures and die are supported on substrates or circuit boards. Therefore, the present examples are to be considered as illustrative and not restrictive, and the invention is not to be limited to the details given herein, but may be modified within the scope of the appended claims.

What is claimed is:

1. A multi-layered lead frame for use in a semiconductor package, the multi-layered lead frame comprising a second lead trace layer superimposed over and adhered to a first lead trace layer, the first and second lead trace layers each having a multiplicity of leads having outer portions and inner portions, wherein the outer portions of at least some of the leads in the second trace layer are superimposed over and are electrically connected to corresponding outer portions of an associated lead in the first trace layer and the outer portions of said some of the leads in the second lead trace layer and the corresponding outer portions of the associated leads in the first trace layer are arranged to connect with external circuitry, and wherein at least some of the traces in the first trace layer have different patterns than the corresponding traces in the second trace layer such that the inner portions of at least some of the leads in the first trace layer do not underlie the inner portions of their associated leads in the second trace layer.

2. A multi-layered lead frame as recited in claim 1 further comprising solder interposed between the first and second lead trace layers for bonding the trace layers together.

3. A multi-layered lead frame as recited in claim 1 wherein said first and second lead trace layers are each in the range of about 2–4 mils thick.

4. A multi-layered lead frame as recited in claim 3 wherein said first and second lead trace layers are each about 3 mils thick.

5. A multi-layered lead frame as recited in claim 2 wherein the solder is a high temperature solder.

6. A multi-layered lead frame as recited in claim 4 wherein each lead includes a lead tip and wherein the pitch between the centers of two selected adjacent lead tips is less than about 5 mils.

7. A multi-layered lead frame as recited in claim 1 wherein a at least one of the leads in the first trace layer crosses over a non-matching lead in the second trace layer, the multi-layered lead frame further comprising an insulating material that electrically isolates the crossing leads.

8. A multi-layered lead frame as recited in claim 7 wherein the insulating material is a layer of double sided polyimide tape that is sandwiched between the first and second trace layers.

9. An integrated circuit package comprising:

(a) a multi-layer lead frame having a second lead trace layer superimposed over and adhered to a first lead trace layer, the first and second lead trace layers each having a multiplicity of leads having outer portions and inner portions, wherein the outer portions of at least some of the leads in the second trace layer are superimposed over and are electrically connected to corresponding outer portions of an associated lead in the first trace layer and the outer portions of said some of the leads in the second lead trace layer and the corresponding outer portions of the associated leads in the first trace layer are arranged to connect with external circuitry, and wherein at least some of the traces in the first trace layer have different patterns than the corresponding traces in the second trace layer such that the inner portions of at least some of the leads in the first trace layer do not underlie the inner portions of their associated leads in the second trace layer;

(b) an integrated circuit die having a multiplicity of bond pads;

(c) connecting wires for electrically coupling selected ones of the bond pads to associated ones of the leads of the first and second lead trace layers; and (d) an encapsulation material molded over the die, connecting wires, and an inner lead portion of the lead frame to form a protective package that leaves an exterior portion of the outer portion of the leads of the first and second lead trace layers exposed to allow connection to external circuitry.

10. A semiconductor package as recited in claim 9 wherein a plurality of integrated circuit dies are provided and electrically connected to the lead frame.

11. A semiconductor package as recited in claim 10 wherein the lead frame further comprises a plurality of die attach pads that each form a portion of an associated one of the trace layers, the die attach pads forming surfaces to which the integrated circuit dies are attached.

12. A semiconductor package as recited in claim 9 wherein the exterior portion of the lead frame is formed into a plurality of pins that are arranged to electrically connect the semiconductor package to external circuit components.

13. A semiconductor package as recited in claim 9 wherein said encapsulation material is plastic.

14. An integrated circuit package comprising:

(a) a multi-layer lead frame having a second lead trace layer superimposed over and adhered to a first lead trace layer, the first and second lead trace layers each having a multiplicity of leads having outer portions and inner portions, wherein at least some of the traces in the first trace layer have different patterns than the corresponding traces in the second trace layer such that the inner portions of at least some of the leads in the first trace layer do not underly the inner portions of their associated leads in the second trace layer;

(b) an integrated circuit die having a multiplicity of bond pads;

(c) a plurality of multi-routing connecting wires for electrically coupling a portion of the bond pads to a portion of the leads of the first trace layer and a portion of the leads of the second lead trace layers; and (d) an encapsulation material molded over the die, connecting wires, and an inner lead portion of the lead frame to form a protective package.

* * * * *